(12) United States Patent
Sato et al.

(10) Patent No.: US 9,425,244 B2
(45) Date of Patent: Aug. 23, 2016

(54) DISPLAY DEVICE

(71) Applicant: Japan Display Inc., Tokyo (JP)

(72) Inventors: Toshihiro Sato, Tokyo (JP); Haochun Lee, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/986,360

(22) Filed: Dec. 31, 2015

(65) Prior Publication Data

US 2016/0211311 A1    Jul. 21, 2016

(30) Foreign Application Priority Data

Jan. 20, 2015 (JP) ................................. 2015-008276

(51) Int. Cl.
*H01L 33/00* (2010.01)
*H01L 27/32* (2006.01)

(52) U.S. Cl.
CPC ......... *H01L 27/3272* (2013.01); *H01L 27/322* (2013.01); *H01L 27/326* (2013.01)

(58) Field of Classification Search
CPC ............. H01L 27/3272; H01L 27/326; H01L 27/322; G02F 1/13338
USPC ....................................................... 257/89
See application file for complete search history.

(56) References Cited

U.S. PATENT DOCUMENTS

| 8,188,477 | B2 * | 5/2012 | Miyairi ............... H01L 27/1225 257/258 |
| 2013/0100388 | A1 * | 4/2013 | Matsushima ..... G02F 1/134363 349/123 |
| 2014/0062294 | A1 | 3/2014 | Toyoda et al. |
| 2015/0219948 | A1 * | 8/2015 | Kamimura .......... G02F 1/13338 349/12 |

FOREIGN PATENT DOCUMENTS

JP    2014049313 A    3/2014

* cited by examiner

*Primary Examiner* — David S Blum
(74) *Attorney, Agent, or Firm* — Typha IP LLC

(57) ABSTRACT

A display device is provided including a display region arranged with a plurality of the pixels in a matrix, the plurality of pixels including a light emitting region, a first light shielding layer, and a second light shielding layer, wherein the first light shielding layer includes a plurality of first apertures opening the light emitting region, and a plurality of second apertures opening a non-light emitting region between the plurality of the pixels, and the second light shielding layer is arranged below the first light shielding layer and includes a plurality of third apertures opening the light emitting region, the second light shielding layer being arranged with a light shielding region below the second apertures.

19 Claims, 17 Drawing Sheets

DISPLAY DEVICE

CROSS REFERENCE TO RELATED APPLICATIONS

This application is based upon and claims the benefit of priority from the prior Japanese Patent Application No. 2015-008276 filed on Jan. 20, 2015, the entire contents of which are incorporated herein by reference.

FIELD

The present invention is related to a display device. In particular, the present invention is related to the structure of a pixel in a display region of a display device.

BACKGROUND

An organic electroluminescence (referred to herein as "organic EL") display device is arranged with a light emitting device in each pixel and displays an image by controlling the light emitted by each element. The light emitting device has a structure in which a layer (referred to herein as "light emitting layer") including an organic EL material is sandwiched between a pair of electrodes, one being an anode and the other a cathode. An organic EL display device is arranged with an electrode as an individual pixel electrode for each pixel, and the other electrode is arranged across a plurality of pixels as a common pixel electrode applied with a common potential. In the organic EL display device, the light emitted by a pixel is controlled by applying a potential of an individual pixel electrode for each pixel with respect to a potential of the common electrode.

For example, a display device which realizes full color by combining a self-light emitting device and a color filter in particular is generally formed by bonding together a substrate and a color filter substrate as is disclosed in Japanese Laid Open Patent No. 2014-049313. An array substrate includes a plurality of light emitting devices arranged in a matrix shape. A color filter substrate is arranged with a R (red), G (green) and B (blue) color filter and a light shielding layer (also called a black matrix) which sections each color filter. Light leaking between pixels is blocked by arranging the light shielding layer and display defects such as mixing of each color are prevented.

However, as the miniaturization of display devices progresses and the size of pixels and the distance between adjacent pixels becomes smaller, there is concern that the anode electrode of pairs of adjacent pixels comes closer together which could lead to mixing of colors due to a charge leak between pixels.

Furthermore, in the case where a metal material with high reflectance is used as the anode electrode, external light entering the display device is reflected by the boundary surface of the anodes and may lead to defects due to light interference.

SUMMARY

One embodiment of a display device according to the present invention includes a display region arranged with a plurality of pixels in a matrix, the plurality of the pixels including a light emitting region, a first light shielding layer, and a second light shielding layer, wherein the first light shielding layer includes a plurality of first apertures opening the light emitting region, and a plurality of second aperture opening a non-light emitting region between the plurality of the pixels, and the second light shielding layer is arranged below the first light shielding layer and includes a plurality of third aperture opening the light emitting region, the second light shielding layer being arranged with a light shielding region below the second apertures.

One embodiment of a display device according to the present invention includes a display region arranged with a plurality of pixels in a matrix, the plurality of the pixels including a light emitting region, a first light shielding layer, and a third light shielding layer, wherein the first light shielding layer includes a plurality of first apertures opening a light emitting region, the third light shielding layer includes a plurality of third apertures opening a light emitting region, a plurality of fourth apertures opening a non-light emitting region between the plurality of the pixels, and a spatial frequency of the display device arranged above the first light shielding layer has a larger figure than a spatial frequency of the display region in the case where the third light shielding layer is excluded.

One embodiment of a display device according to the present invention includes a display device including a display region arranged with a plurality of pixels in a matrix, the plurality of the pixels including a light emitting region, and a first light shielding layer, wherein the first light shielding layer includes a plurality of first apertures opening the light emitting region, and a plurality of second apertures opening a non-light emitting region between the plurality of the pixels, each of the first apertures forms each of L character shapes, the plurality of the first apertures include four of the first apertures consisting of four of the L character shapes, the four of the first apertures are arranged in two adjacent rows and columns, the four of the L character shapes include a first pair of the L character shapes and a second pair of the L character shapes, the first pair of the L character shapes are arranged point symmetrically, and the second pair of the L character shapes are arranged point symmetrically.

One embodiment of a display device according to the present invention includes a first substrate, a display region arranged above the first substrate including a plurality of pixels arranged in a matrix, the plurality of the pixels including a light emitting region, a first light shielding layer, and a third light shielding layer; wherein the first light shielding layer includes a plurality of first apertures opening the light emitting region, at least one part of the third light shielding layer is arranged on an opposite side of the light shielding layer from the first substrate, and the third light shielding layer includes a plurality of fourth apertures which are larger in number than the plurality of the first apertures.

DESCRIPTION OF THE EMBODIMENTS

The embodiments of the present invention are explained below while referring to the diagrams. However, the present invention can be realized by various different forms and should not be interpreted as being limited to the contents described in the embodiments exemplified below. In addition, although the width, thickness and shape of each component are represented schematically compared to actual component in order to better clarify the explanation of the invention, these are merely examples and should not limit an interpretation of the present invention. In addition, in the present specification and each diagram, the same reference symbols are attached to the same elements which have been previously been described and therefore a detailed explanation of such elements may be omitted.

In the present specification, when certain components or regions are described as [above (or below)] other components or regions, unless specified otherwise, this includes not only being directly above [or directly below] other components or regions, but also above [or below] other components or regions, that is, other structural components may be included therebetween.

First Embodiment

As high definition of display devices progresses, it is known that a rainbow pattern in a display region occurs due to reflected light of external light entering the display device which leads to the problem of degradation in the visibility of a display image. In addition, since this problem also occurs during a non-display state, this is not preferable in terms of product image This problem is in particularly apparent in display devices where a white light emitting device which does not use a circular polarization plate and a color filter are bonded together. It is thought that the reason for this is light interference generated in an aperture end part of a light shielding layer (also called a black matrix). A structure for solving this problem is shown in the present embodiment.

Figure 1:
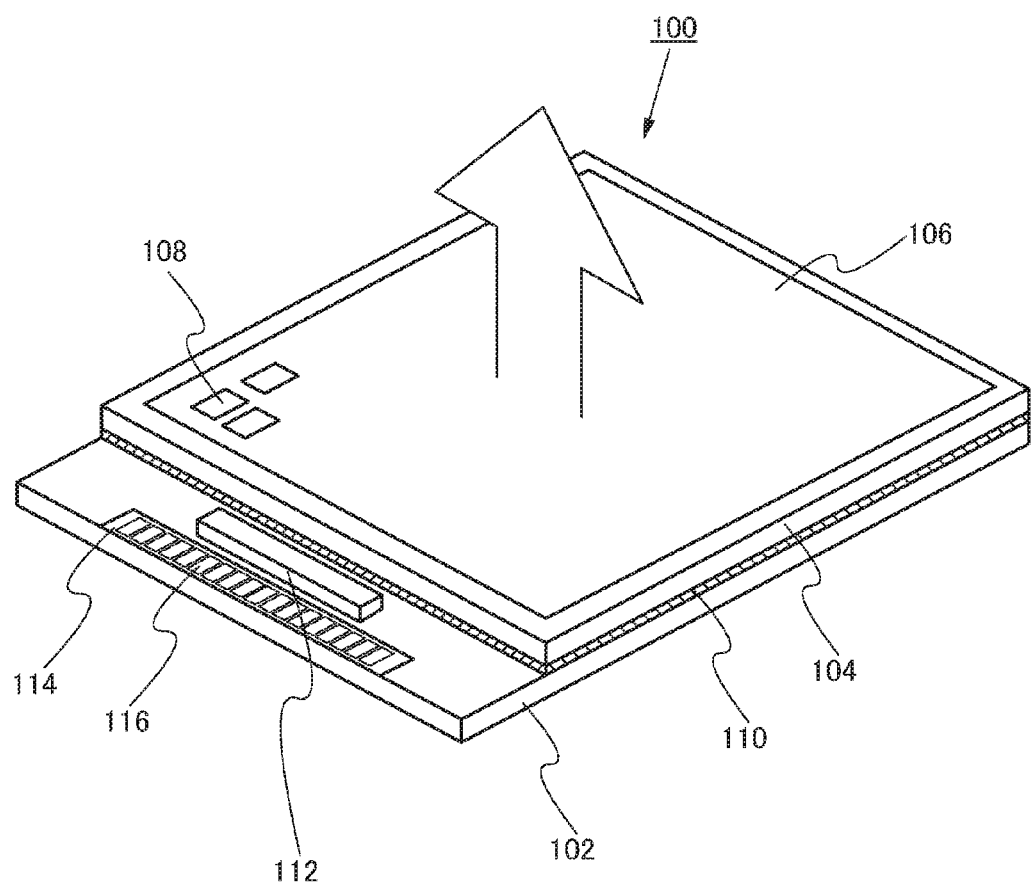
FIG. 1 is a perspective view diagram showing a structure of a display device related to one embodiment of the present invention.

The structure of a display device 100 related to the present embodiment is explained while referring to FIG. 1. The display device 100 is arranged with a display region 106 in a first substrate 102. The display region 106 is formed by arranging a plurality of pixels 108. A second substrate 104 is arranged as a sealing material on an upper surface of the display region 106. The second substrate 104 is fixed to the first substrate 102 by a sealing material 110 which encloses the display region 106. The display region 106 formed in the first substrate 102 is sealed so as not to be exposed to the air by the second substrate 104 which is a sealing material and the seal component 104. Degradation of light emitting devices arranged in a pixel 108 is suppressed by this sealing structure.

The first substrate 102 is arranged with a terminal region 144 at one end. The terminal region 114 is arranged on the exterior side of the second substrate 104. The terminal region 114 is formed by a plurality of connection terminals 116. A wiring substrate for connecting devices for outputting a video signal or a power source with a display panel is arranged on the connection terminal 116. The connection point of the connection terminal 116 which is connected with the wiring substrate is exposed to the exterior. A driver circuit 112 for outputting a video signal input from the terminal region 114 to the display region 116 may also be arranged on the first substrate 102.

Figure 2:
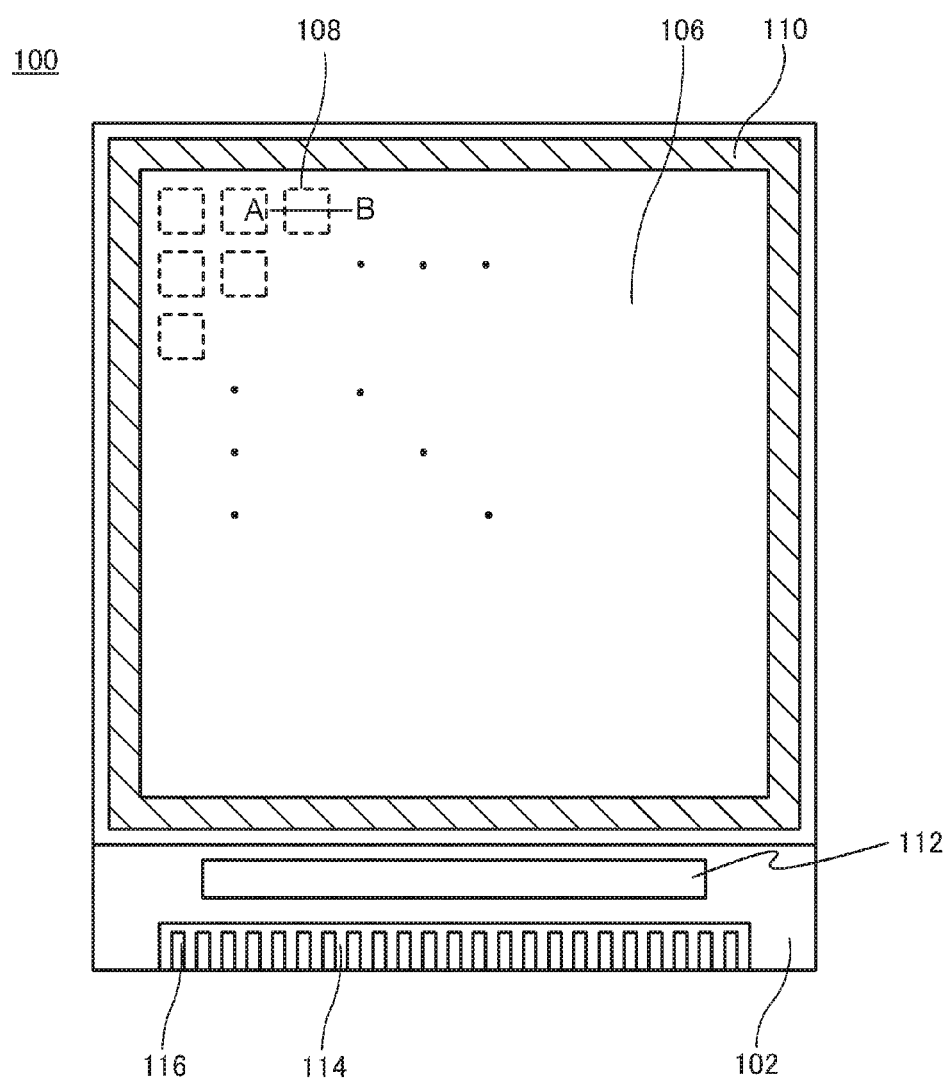
FIG. 2 is a planar view diagram showing a structure of a display device related to one embodiment of the present invention.
Figure 3:
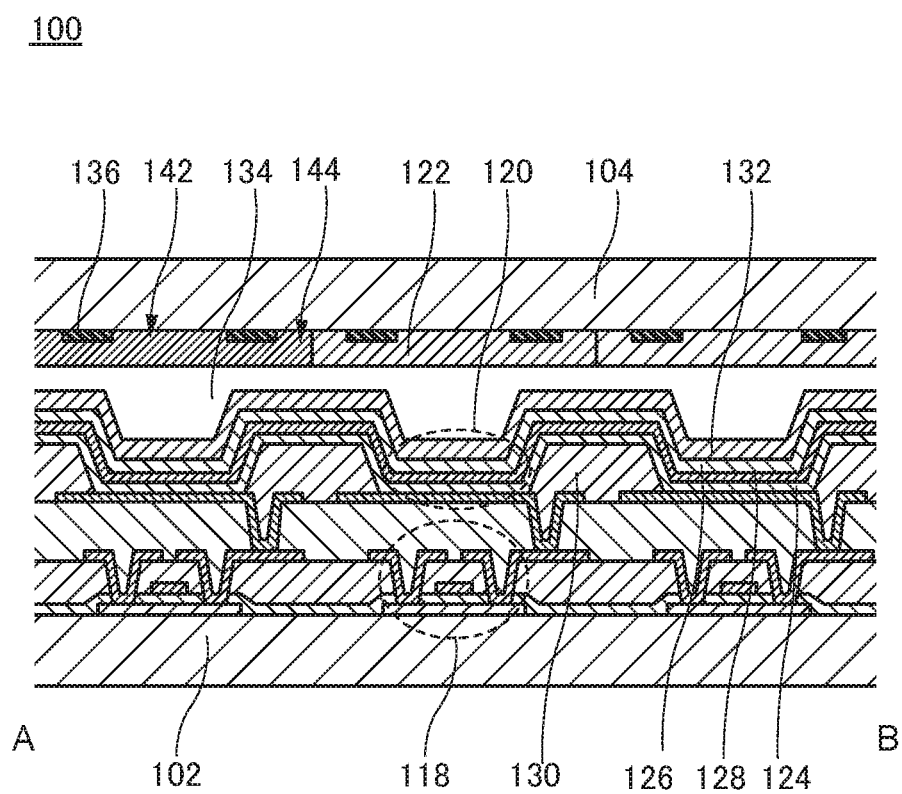
FIG. 3 is a cross-sectional diagram showing a structure of a display device related to one embodiment of the present invention.
Figure 4:
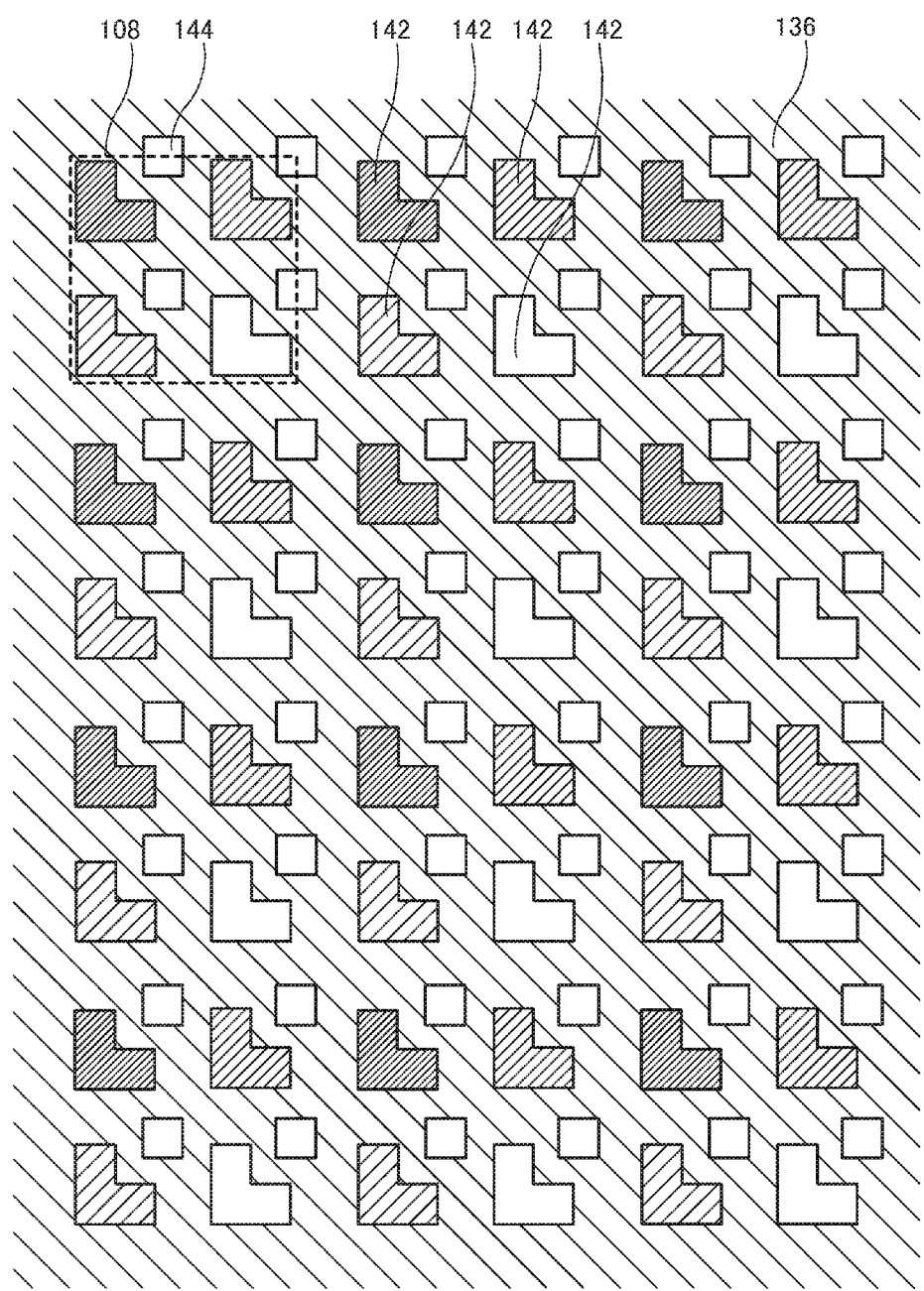
FIG. 4 is a planar view diagram showing a light shielding layer arranged in a display device related to one embodiment of the present invention.

The structure of the display device 100 related to the present embodiment is explained while referring to FIG. 2~FIG. 4. FIG. 2 is a planar view diagram showing the structure of the display device 100 related to the present embodiment. FIG. 3 is a cross-sectional diagram showing the structure of the display device 100 related to the present invention. FIG. 4 is a planar view diagram showing a light shielding layer arranged in the display device 100 related to the present embodiment.

As is shown in FIG. 2, a plurality of pixels 108 are arranged in a matrix in the display region 106 which forms a display screen above the first substrate 102. A horizontal scanning circuit and horizontal scanning circuit which input a signal to the display region 106 may also be arranged as other components in a periphery part on the first substrate 102.

FIG. 3 is a cross-sectional diagram between A and B which passes through one pixel shown in FIG. 2. Each of the plurality of pixels 108 includes a plurality of light emitting regions. Each of the plurality of light emitting regions are separated into adjacent light emitting regions by a bank 130 arranged in the periphery of the light emitting regions. Each of the plurality of light emitting regions includes a transistor 118, a light emitting device 120 which emits white light and either a red, green, blue or white color filter 122 arranged thereupon and a sub-pixel is formed which emits each color of light.

The light emitting device 120 has a structure in which an individual pixel electrode 124 (also referred to simply as "pixel electrode"), a light emitting layer 128 and a common pixel electrode 126 (also referred to as common electrode)

are stacked in order. The individual pixel electrode 124 is arranged individually in each light emitting device 120 and a different potential is supplied to a sub-pixel via the transistor 118. The common pixel electrode is arranged in common in all of the light emitting devices 120.

The individual pixel electrode 124 is preferred to be formed using a metal with high reflectance in order to reflect light generated by the light emitting layer 128 to the side of the common pixel electrode 126. Alternatively, the individual pixel electrode 124 may have a stacked structure of a metal film and transparent conductive film and may also include a light reflective surface.

The light emitting layer 128 is arranged in common in the plurality of pixels 108 and is arranged so as to cover the individual pixel electrode 124 and the bank 130 between sub-pixels.

In the case where the light emitting layer 128 is comprised from an organic EL layer for example, the light emitting layer 128 is formed using a low molecular or high molecular organic material. In the case where a low molecular organic material is used, in addition to the light emitting layer 128 including an organic material with light emitting properties, a hole injection layer and electrode injection layer and also a hole transport layer and electrode transport layer may be included to sandwich the light emitting layer. In the present embodiment, the light emitting layer 128 uses an element which emits white light and emitting light in full color is realized by a color filter. Furthermore, a so-called tandem type structure in which a plurality of light emitting layers (organic EL layers for example) are stacked may also be used for the light emitting layer 128.

It is preferred that the common pixel electrode 126 is formed using a transparent conductive film such us ITO (tin oxide doped indium oxide) or IZO (indium oxide zinc oxide) including translucency and conductivity in order to allow light generated by the light emitting layer 128 to pass through. Alternatively, a metal layer formed to a thickness through which light can pass through may also be used as the common pixel electrode 126.

A sealing film 132 is arranged above the common pixel electrode 126. The sealing film 132 is preferred to be an insulation film which can block the infiltration of moisture. It is possible to use an inorganic insulation film or organic insulation film as the insulation film.

For example, in the case where an inorganic insulation film is used as the insulation film, it is possible to use films such as silicon oxide (SIOx), silicon nitride (SINx), silicon oxynitride (SIOxNy), silicon nitride oxide (SINxOy), aluminum oxide (AlOx), aluminum nitride (AlNx), aluminum oxynitride (AlOxNy) or aluminum nitride oxide (AlNyOx) (x and y are optional). In addition, a structure in which these films are stacked may also be used. It is possible to use a plasma CVD method or sputtering method as the film formation method.

In the case where an organic insulation film is used as the insulation film, it is possible to use films such as polyimide resin, acryl resin, epoxy resin, silicon resin, fluorine resin or siloxane resin and the like. In addition, a structure in which these materials are stacked may also be used. It is possible to use an evaporation method or vapor deposition polymerization method as the film formation method.

A structure in which the inorganic insulation film and organic insulation film described above are combined may also be used as the sealing film 132.

While retaining a gap with the first substrate 102, a transparent second substrate 104 is covered by the sealing material 110. A space enclosed by the second substrate 104, sealing material 110 and sealing film 132 is filled with a filling material 134 comprised from a transparent epoxy resin for example.

Although not shown in FIG. 2, the display region is covered by a first light shielding layer 136 including a plurality of apertures. The first light shielding layer 136 is arranged above a color filter 122 and includes a plurality of first apertures 142 opening a light emitting region, and a plurality of second apertures 144 opening a non-light emitting region. As long as it is a non-light emitting region the second aperture 144 may be arranged within a pixel or between pixels. That is, among the light emitted by a light emitting region, light which has passed through the first aperture 142 is visible to an observer.

The second aperture 144 is a dummy aperture arranged above a non-light emitting region. When light from the exterior of a display device enters the device in a non-display state, since the individual pixel electrode 124 is a reflection layer, a rainbow pattern is sometimes generated in the display region 106 due to interference of light reflected by the reflection layer. This problem occurs particularly as high definition progresses.

The spatial frequency of the display region 106 increases by arranging a second aperture. Spatial frequency is defined by the unit "cycle per degree". In the present specification, the spatial frequency corresponds to the cycles of an aperture per degree (or simply "number of apertures per degree"). Spatial frequency has a correlation with contrast which is viewed by person. If spatial frequency is certain level or more, contrast decreases as spatial frequency increases.

In other words, increasing spatial frequency by arranging the second aperture 144 leads to a drop in the contrast of a rainbow pattern due to the reflection of exterior light and makes it difficult to view the rainbow pattern.

Consequently, it is possible to suppress a rainbow pattern which occurs in a non-display state of a display device as high definition progresses, and it is possible to provide the display device 100 with high definition without degrading product image.

FIG. 4 is a planar view diagram of the first light shielding layer 136 of the display device 100 related to the present embodiment. Although the shape of the first aperture 142 and second aperture 144 is not particularly limited, it is preferred to secure a large area as much as possible from the viewpoint of a high aperture ratio.

The shape of the first aperture 142 of the first light shielding layer 136 shown in FIG. 4 is a roughly L character shape. In other words, two adjacent sides of a square are connected to one side of two squares joined to the first square respectively.

Although the shape of the second aperture 144 is shown as a square in the present embodiment, the shape of the second aperture 144 is not limited to a square. The second aperture 144 is arranged in order to increase spatial frequency and is preferred to be arranged as densely as possible. Although one second aperture 144 is arranged within one pixel in the present embodiment, a plurality of second apertures 144 may also be arranged with one pixel or between pixels.

The spatial frequency of the display device 100 according to the present embodiment has a range of 90 cpd~110 cpd. In this range there are no problems with display characteristics with respect to visibility of reflected exterior light.

Varied Example

A Varied example of the layout of the first aperture 142 and second aperture of the first light shielding layer 136 is shown while referring to FIG. 5~FIG. 11.

Figure 5:
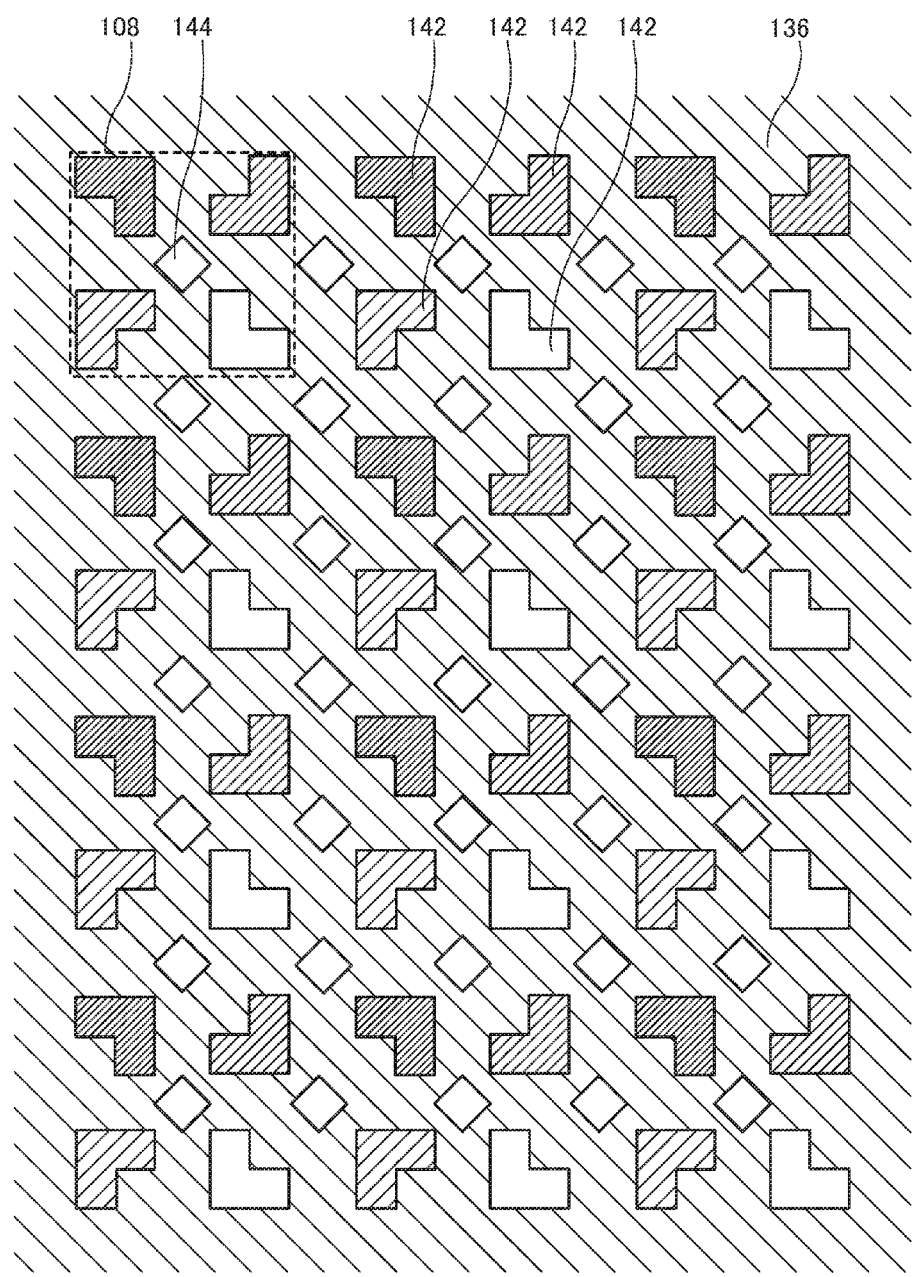
FIG. 5 is a planar view diagram showing a light shielding layer arranged in a display device related to one embodiment of the present invention.

Although each shape of the plurality of first apertures 142 shown in FIG. 5 is a roughly L character shape the same as in the present embodiment, four sub-pixels on two adjacent rows and columns are arranged so as to form a point symmetry shape in one pixel. It can be seen that the characteristics during display are excellent when this type of shape and arrangement of the first aperture 144 is selected.

The plurality of second apertures 144 arranged as a measure against degradation in visibility due to reflected exterior light has a diamond shape in the present varied example, and one second aperture 144 is arranged per pixel and one is arranged between pixels which are vertically, horizontally and diagonally adjacent. However, the shape, arrangement and number of second apertures 144 are not limited.

Figure 6:
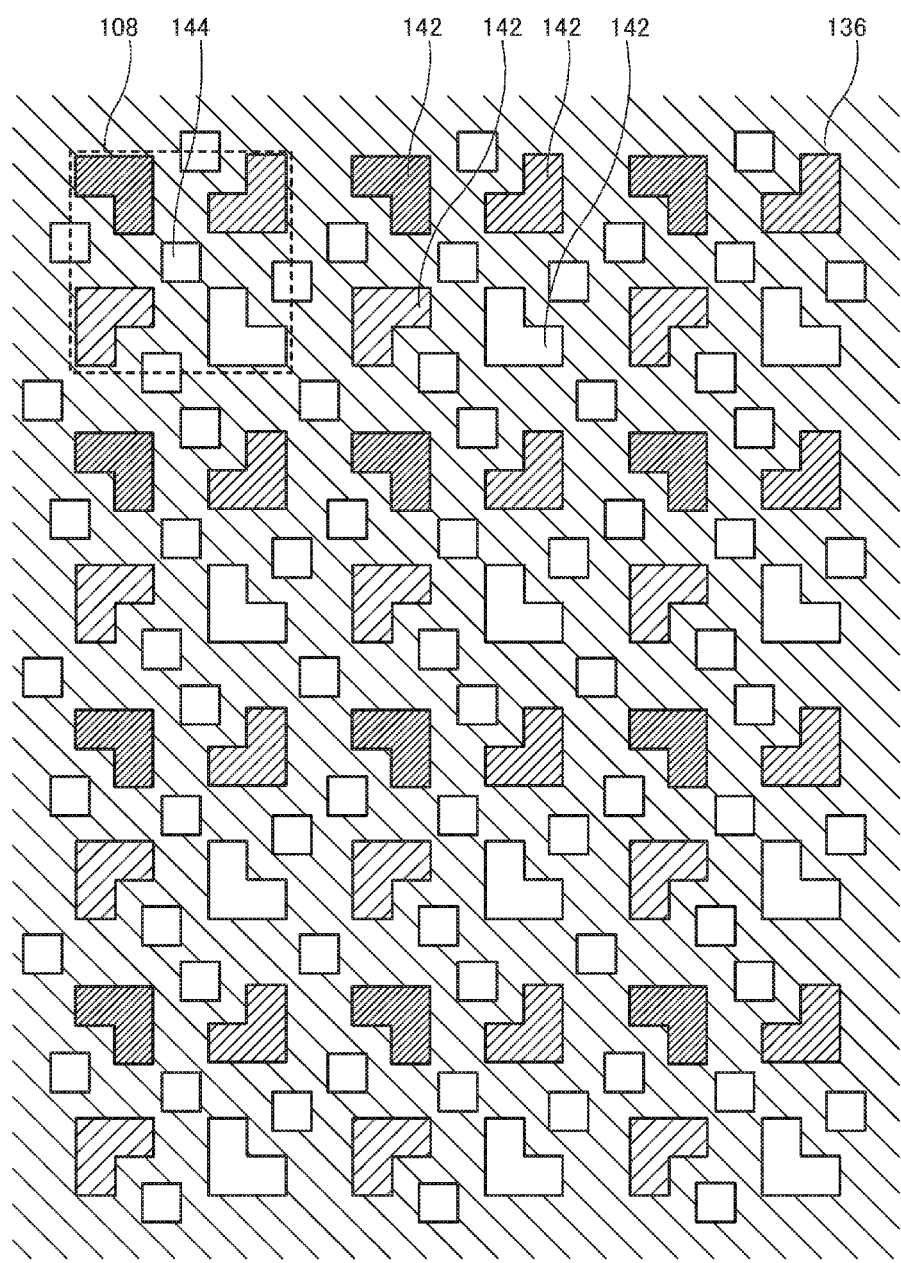
FIG. 6 is a planar view diagram showing a light shielding layer arranged in a display device related to one embodiment of the present invention.

Another varied example of the layout of the first aperture 142 and second aperture 144 of the first light shielding layer 136 according to the present embodiment is shown in FIG. 6. Although the shape and arrangement of the first aperture 142 are similar compared to FIG. 5, the shape and arrangement of the second aperture 144 are different. The shape of the second aperture 144 is a square and there are more squares compared to FIG. 5. It is possible to increase spatial frequency by increasing the number of second apertures 144 within a display area and further suppress the occurrence of a rainbow pattern due to reflected exterior light.

Figure 7:
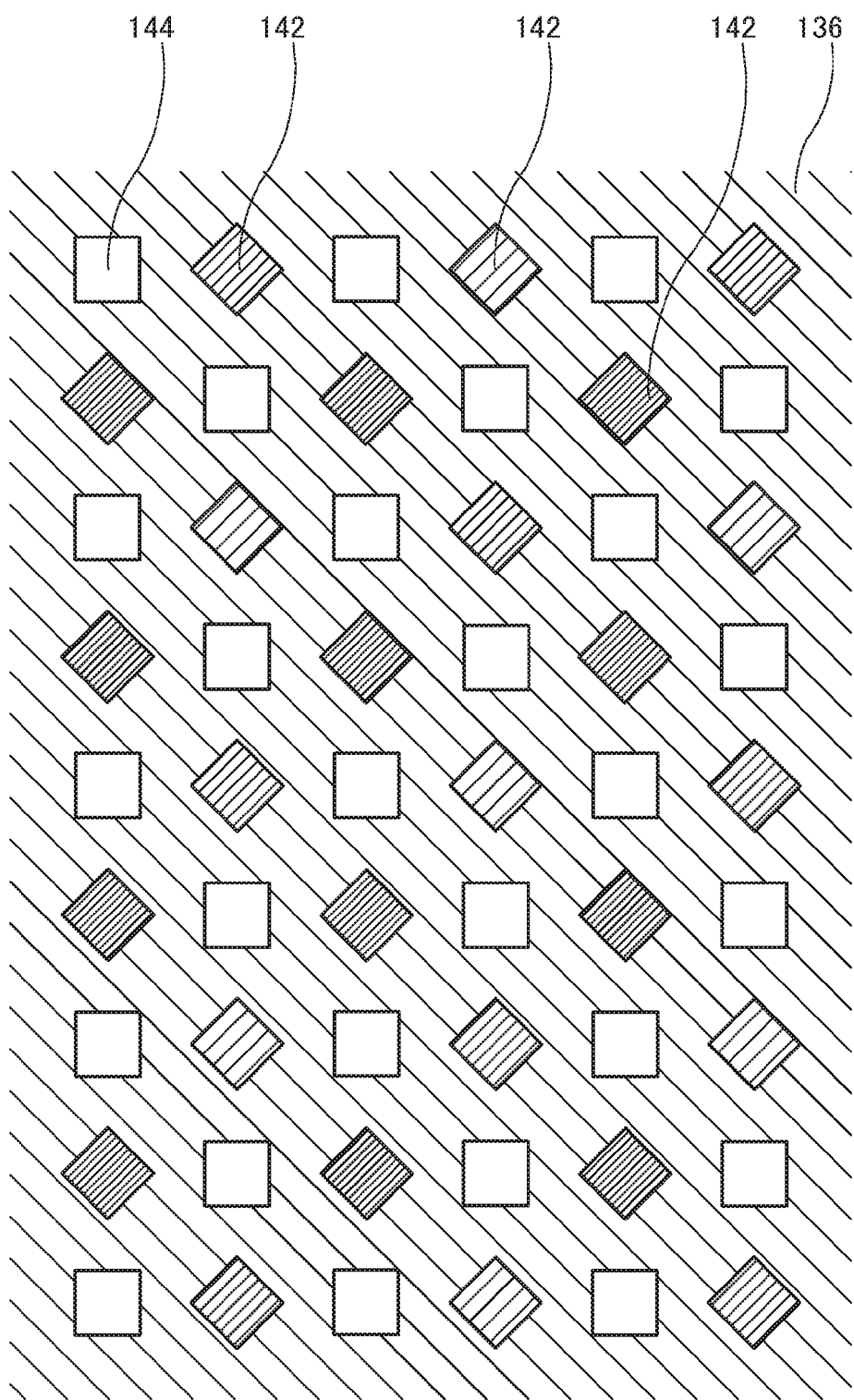
FIG. 7 is a planar view diagram showing a light shielding layer arranged in a display device related to one embodiment of the present invention.

Another varied example of the layout of the first aperture 142 and second aperture 144 of the first light shielding layer 136 according to the present embodiment is shown in FIG. 7. The first aperture 142 has a diamond shape and the second aperture 144 has a square shape.

Figure 8:
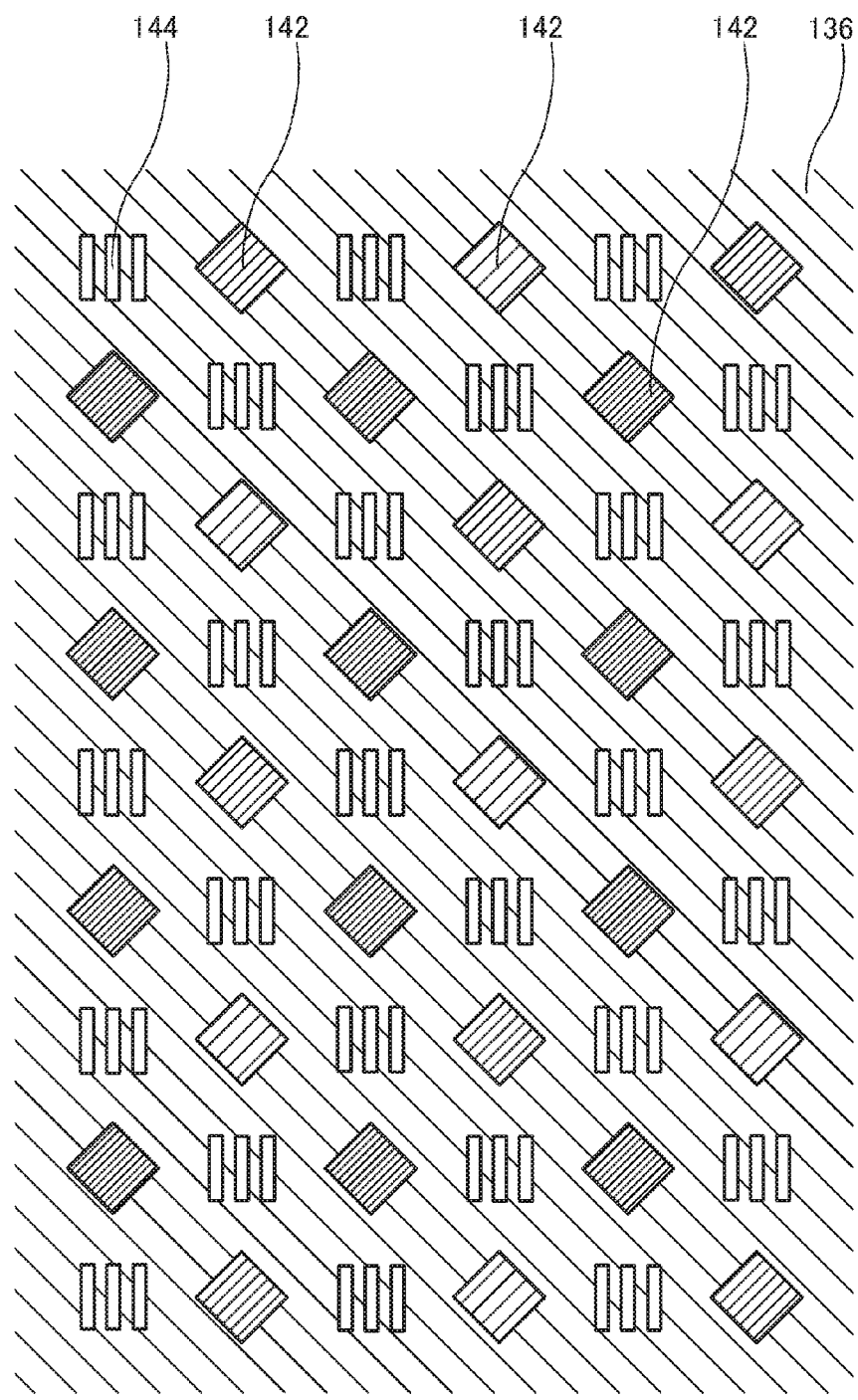
FIG. 8 is a planar view diagram showing a light shielding layer arranged in a display device related to one embodiment of the present invention.

Another modified example of the layout of the first aperture 142 and second aperture 144 of the first light shielding layer 136 according to the present embodiment is shown in FIG. 8. The first aperture 142 has a diamond shape the same as in FIG. 7, the second aperture 144 has a shape in which the second aperture 144 in FIG. 7 is divided into three parts and the resulting plurality of second apertures 144 have a common length direction. In this way, a plurality of second apertures 144 may be arranged between adjacent pixels. As a result, spatial frequency is increased compared to FIG. 7 and it is possible to further suppress the occurrence of a rainbow pattern due to reflected exterior light.

Figure 9:
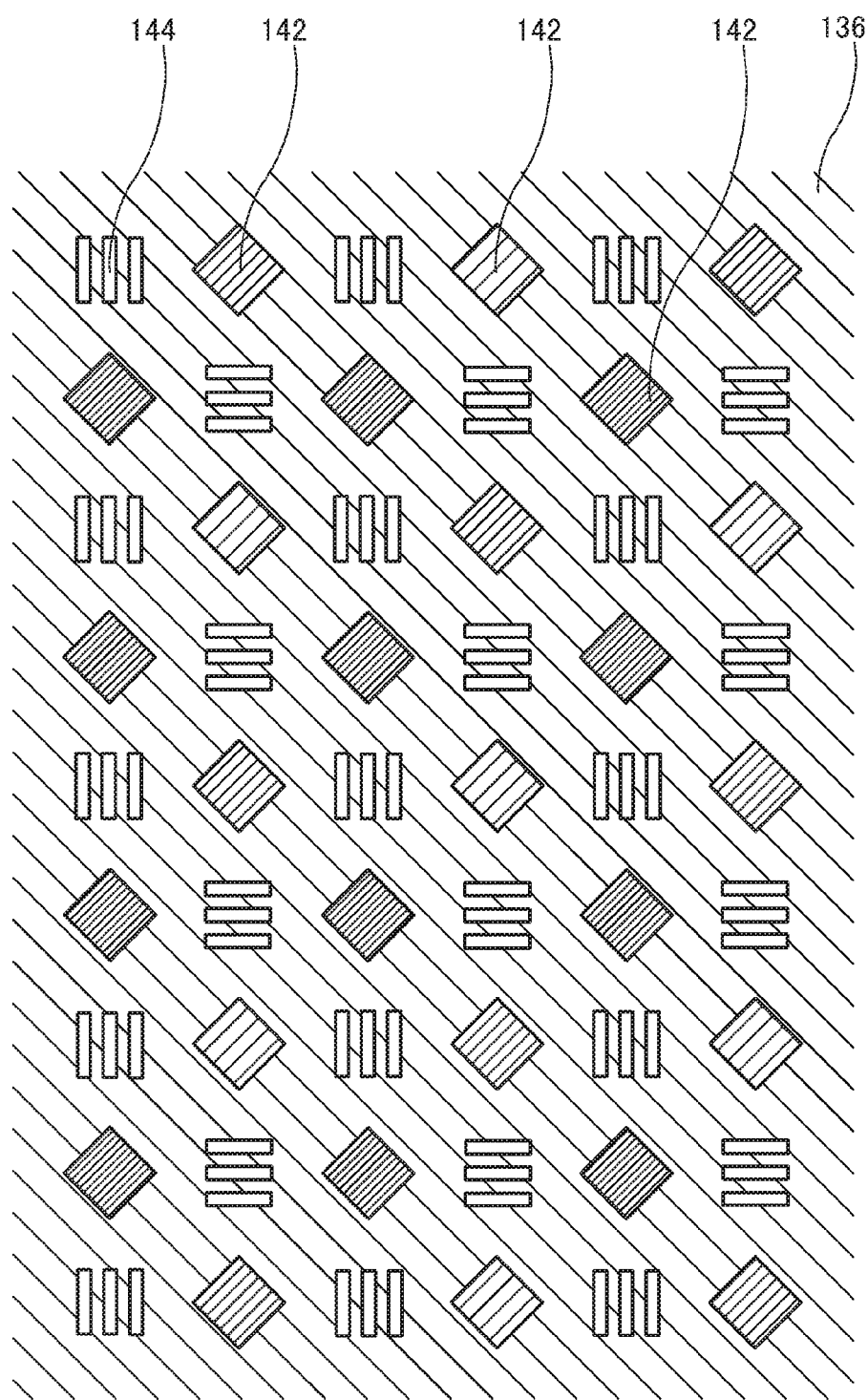
FIG. 9 is a planar view diagram showing a light shielding layer arranged in a display device related to one embodiment of the present invention.

Another varied example of the layout of the first aperture 142 and second aperture 144 of the first light shielding layer 136 according to the present embodiment is shown in FIG. 9. The first aperture 142 has a diamond shape the same as in FIG. 7 and FIG. 8 and the second aperture 144 compared to FIG. 8 includes different length directions. While all of the second apertures 144 in FIG. 8 have a common length direction, the same number of second apertures 144 having mutually alternating length directions are included in FIG. 9. As a result, spatial frequency is increased compared to FIG. 7 and it is possible to further suppress the occurrence of a rainbow pattern due to reflected exterior light and suppress the reliance of image quality on the viewing direction.

Furthermore, among the plurality of pixels 108, when an arbitrary pixel is set as a first pixel, a pixel adjacent to the first pixel is set as a second pixel, and a pixel adjacent to the first pixel on a different side to the second pixel is set as a third pixel, the plurality of the second apertures 144 may include a 1-2 intermediary aperture located between the first pixel and second pixel and having a first length direction, and a 1-3 intermediary aperture located between the first pixel and third pixel and having a second length direction different to the first length direction.

Figure 10:
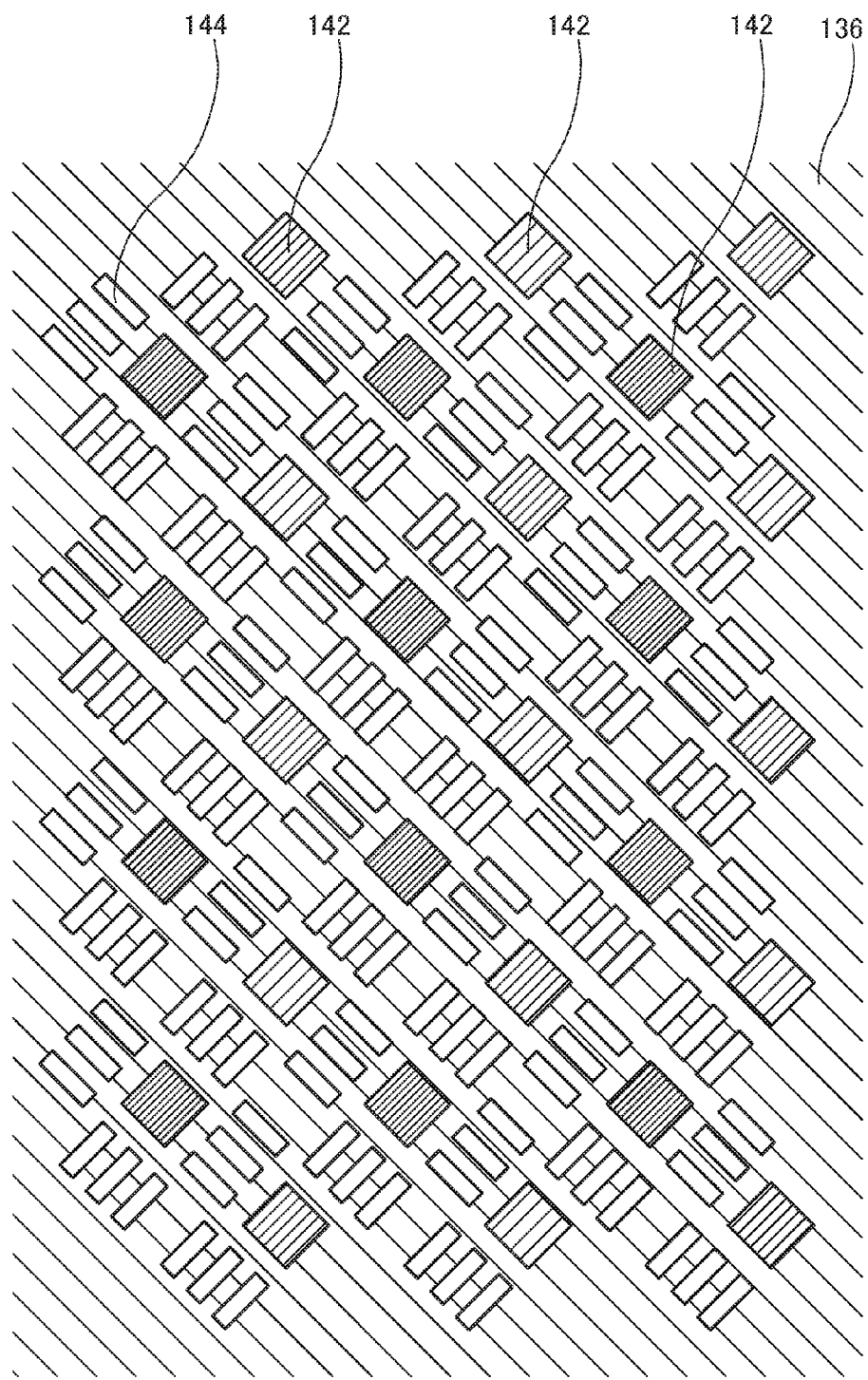
FIG. 10 is a planar view diagram showing a light shielding layer arranged in a display device related to one embodiment of the present invention.

Another modified example of the layout of the first aperture 142 and second aperture 144 of the first light shielding layer 136 according to the present embodiment is shown in FIG. 10. The first aperture 142 has a diamond shape the same as in FIG. 7 to FIG. 9, and the number of second apertures 144 is further increased compared to FIG. 8 and FIG. 9. As a result, there is greater resistance to the occurrence of a rainbow pattern due to reflected external light.

Figure 11:
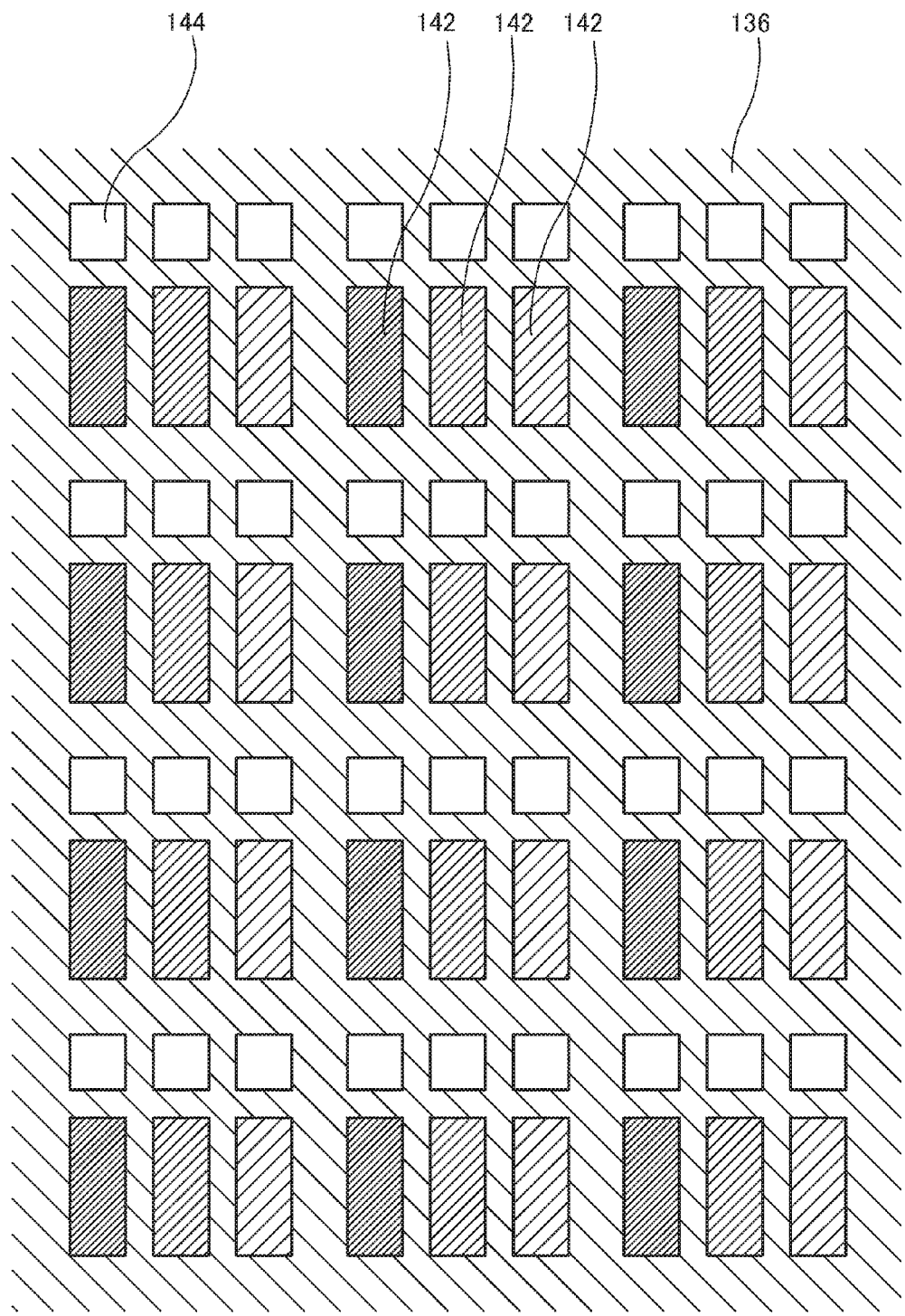
FIG. 11 is a planar view diagram showing a light shielding layer arranged in a display device related to one embodiment of the present invention.

Another modified example of the layout of the first aperture 142 and second aperture 144 of the first light shielding layer 136 according to the present embodiment is shown in FIG. 11. All of the first apertures 142 have a rectangle shape and the second aperture 144 arranged above has a square shape.

The display device 100 according to the preferred embodiments of the present invention was explained above. According to the present embodiment, it is possible to suppress a rainbow pattern which occurs more in a non-display state of the display device 100 as high definition progresses, and it is possible to provide a high definition display device 100 without degrading product image.

Second Embodiment

Figure 12:
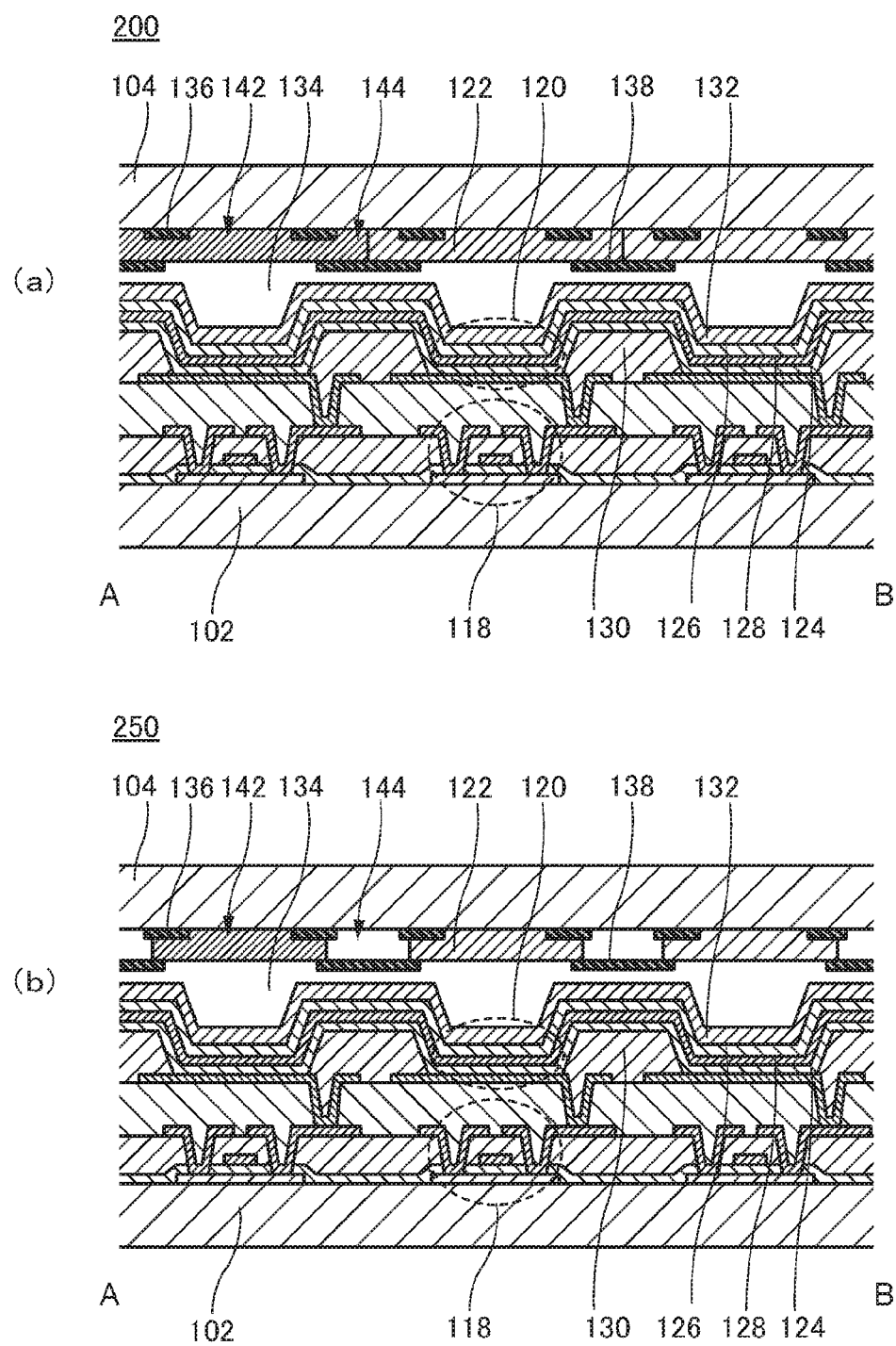
FIG. 12 is a cross-sectional diagram showing a structure of a display device related to one embodiment of the present invention.

A structure of a display device 200 related to the present embodiment is explained while referring to FIG. 12(a).

The display device 200 according to the present embodiment is different compared to the display device 100 according the first embodiment in that it includes a second light shielding layer 138. The layout shown in the varied examples described above and FIG. 4 to FIG. 11 can be used for the first light shielding layer. The second light shielding layer 138 is arranged below the color filter 122. In addition, the second light shielding layer 138 includes a plurality of third apertures 146 which open a light emitting region. That is, the second light shielding layer 138 has an aperture layout so as to shield the external light entering through second aperture 144 of the first light shielding layer 136.

A conventional light shielding layer shields a non-light emitting region in order to prevent light leaking between pixels or mixing of colors. However, in the first embodiment, there is a danger of light leaking or mixed colors from the first light shielding layer 136 due to the second aperture 144. Therefore, in the present embodiment, the second light shielding layer 138 is arranged in order to shield the second aperture 144.

It is possible to suppress display defects such as leaking light and mixed colors while maintaining spatial frequency of a display region increased by the first light shielding layer 136 by arranging the second light shielding layer 136.

The spatial frequency of the display device 200 according to the present embodiment has a range of 90 cpd~110 cpd. In this range there are no problems with display characteristics with respect to visibility of reflected exterior light.

As a varied example, a color filter may include a plurality of color filters, and the plurality of the color filters are separated below the second apertures 144 as in the display device 250 shown in FIG. 12(b).

Third Embodiment

Figure 13:
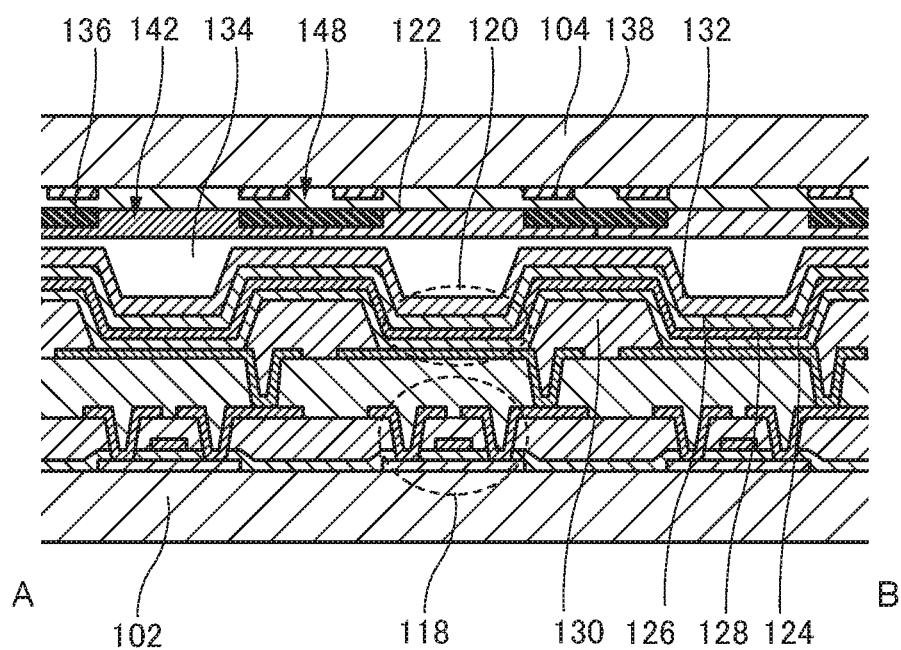
FIG. 13 is a cross-sectional diagram showing a structure of a display device related to one embodiment of the present invention.

The structure of a display device 300 related to the present embodiment is explained while referring to FIG. 13.

The display device 300 according to the present embodiment includes a third light shielding layer 140. The third light shielding later 140 according to the present embodiment is arranged between the second substrate 104 and the first light shielding layer 136. That is, the third light shielding layer 140 is arranged on the opposite side of the first substrate 102 of the first light shielding layer 136. In particular, the third light shielding layer 140 may also be arranged in contact with the first light shielding layer 136.

The third light shielding layer 140 according to the present embodiment is arranged in order to increase spatial frequency of the display region 106 and includes a plurality of fourth apertures 148. The plurality of fourth apertures 148 open a light emitting region and a non-light emitting region between pixels and is larger in number than the first apertures of the first light shielding layer. That is, the plurality of fourth apertures 148 includes a aperture located between a plurality of pixels and a plurality of apertures overlapping one light emitting region. It is possible to increase spatial frequency by arranging the third light shielding layer 140 and suppress the occurrence of a rainbow pattern due to reflected exterior light.

The third light shielding layer 140 may have a sheet shape. A sheet shaped third light shielding layer 140 is arranged with a non-translucent region in a sheet with translucent properties. A transparent resin such as acryl or polyimide for example can be used as a sheet with translucent properties and a non-translucent region can be formed by coating a metal such aluminum, chrome or molybdenum or a black resin. Regions apart from a non-translucent region correspond to the fourth aperture 148. In addition, a non-translucent region may be a semi-transparent region which does not completely shield light.

The spatial frequency of the display device 300 according to the present embodiment has a range of 90 cpd~110 cpd. In this range there are no problems with display characteristics with respect to visibility of reflected exterior light.

Fourth Embodiment

Figure 14:
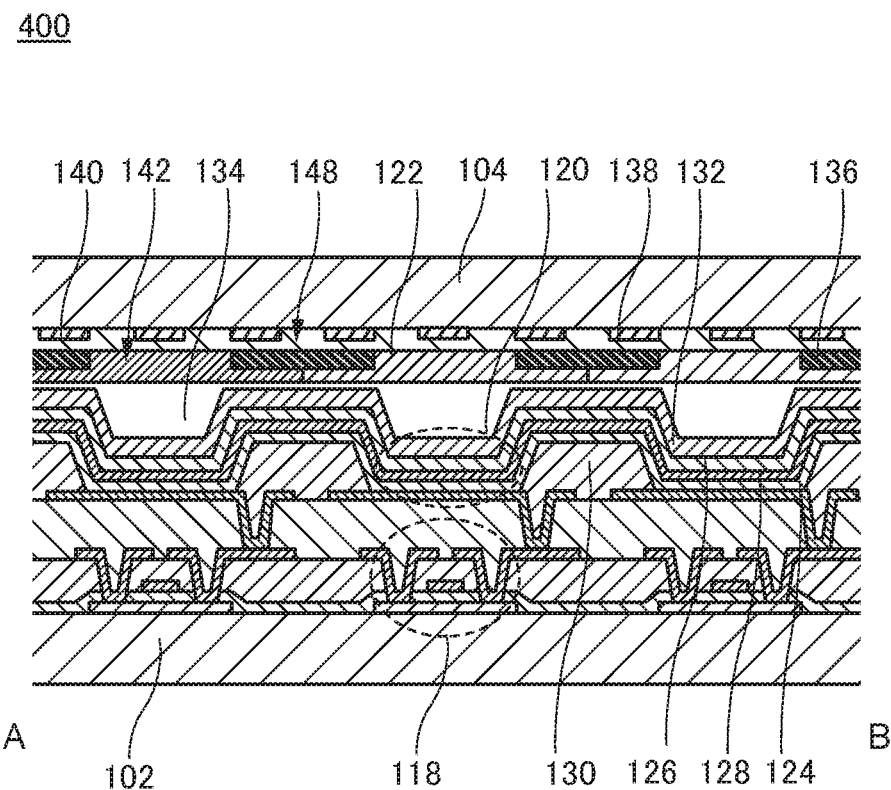
FIG. 14 is a cross-sectional diagram showing a structure of a display device related to one embodiment of the present invention.

A display device 400 related to the present embodiment is explained while referring to FIG. 14.

The display device 400 according to the present embodiment has a different layout of the fourth aperture 148 when compared to the display device 300 according to the third embodiment. The present embodiment includes a layout in which the fourth aperture 148 is arranged so that an upper part region of a light emitting region is also shielded. At this time, it is preferable to use a semi-transparent material and not a material which completely shields light as the material of the light shielding part from the viewpoint of a high aperture ratio. It is preferred to use a resin with a color which has a complementary color relationship with the color filter that is arranged directly below the light shielding part as the semi-transparent material.

It is possible to further increase spatial frequency by also shielding the light of a region of one part of a display region by the third light shielding layer 140. As a result, it is possible to efficiently suppress the occurrence of a rainbow pattern due to reflected exterior light.

The spatial frequency of the display device 400 according to the present embodiment has a range of 90 cpd~110 cpd. In this range there are no problems with display characteristics with respect to visibility of reflected exterior light.

Fifth Embodiment

Figure 15:
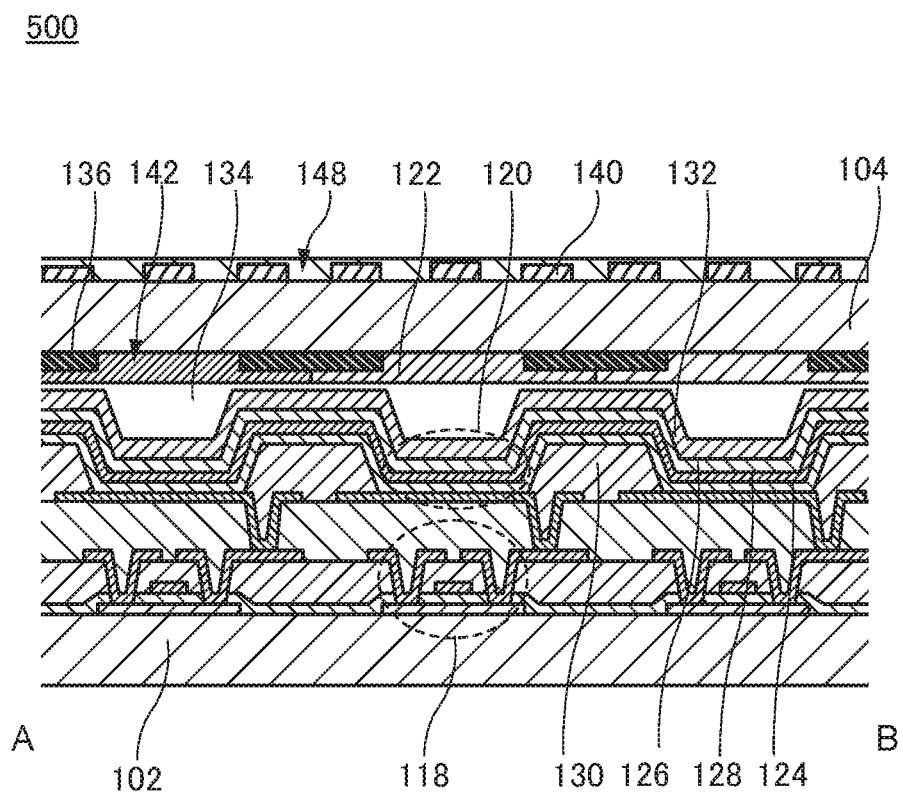
FIG. 15 is a cross-sectional diagram showing a structure of a display device related to one embodiment of the present invention.

The structure of a display device 500 related to the present embodiment is explained while referring to FIG. 15.

The display device 500 according to the present embodiment has a different arrangement of the third shielding layer 140 compared to the display device 400 according to the fourth embodiment. As in the present embodiment, the first light shielding layer 136 may be arranged between the first substrate 102 and second substrate 104 and the third light shielding layer 140 may be arranged on the opposite side of the first light shielding layer from the first substrate 102 of the second substrate 104. The third light shielding layer 140 may also be a sheet shaped light shielding layer as described previously.

The spatial frequency of the display device 500 according to the present embodiment has a range of 90 cpd~110 cpd. In this range there are no problems with display characteristics with respect to visibility of reflected exterior light.

Sixth Embodiment

Figure 16:
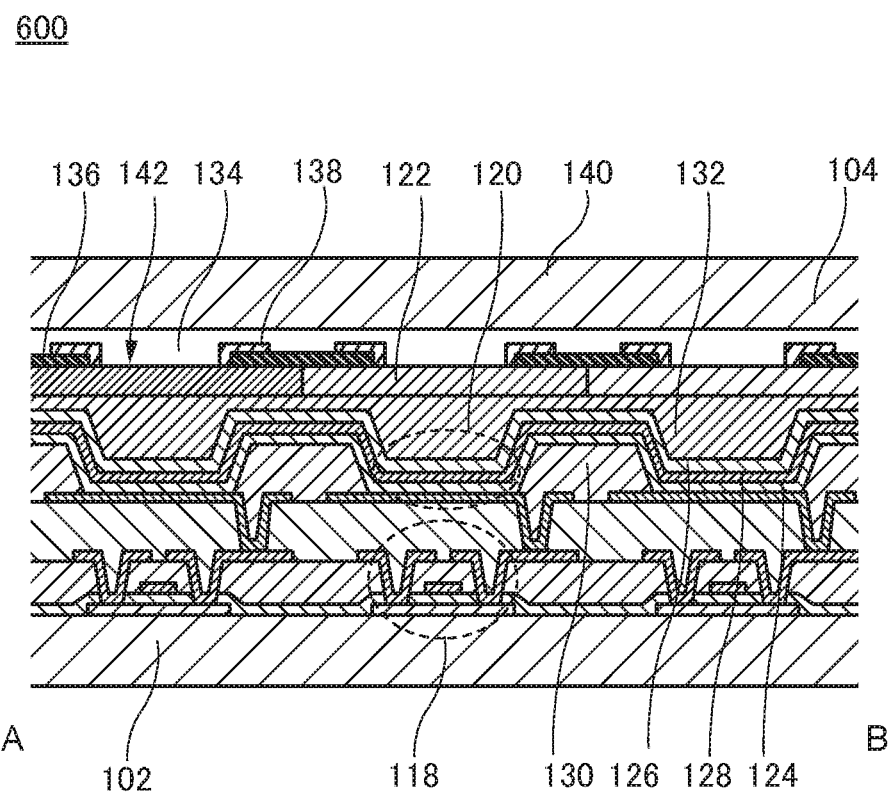
FIG. 16 is a cross-sectional diagram showing a structure of a display device related to one embodiment of the present invention.

The structure of a display device 600 related to the present invention is explained while referring to FIG. 16. The display devices 100 to 500 of the embodiments described previously are first arranged with a color filter on the second substrate 104 side during the manufacturing process and subsequently bonded with the second substrate 102. It is assumed that the structure of the display device 600 of the present embodiment is arranged with a color filter 122 on the first substrate 102 side.

The display device 600 according to the present embodiment is arranged with an individual pixel electrode 124, a light emitting layer 128, a common pixel electrode 126, a sealing film 132, a color filter 122, a first light shielding layer 136 and third light shielding layer 140 in this order above the first substrate 102. That is, the first light shielding layer is arranged on the opposite side of the color filter from the common electrode. Furthermore, the sealing film 132 in FIG. 16 is located above the common pixel electrode 126 and is formed so as to flatten any non-uniform parts based on the shape of the bank 130. The sealing film 132 is formed in the same manner as in FIG. 3, a planarized film may be arranged above the sealing film 132 and the color filter 122 may be arranged above the planarized film.

The spatial frequency of the display device 600 according to the present embodiment has a range of 90 cpd~110 cpd. In this range there are no problems with display characteristics with respect to visibility of reflected exterior light.

Here, a non-light emitting region of the third light shielding layer 140 may be a semi-transparent layer and may be arranged above a light emitting region. As a result, it is possible to increase spatial frequency and efficiently suppress the occurrence of a rainbow pattern due to reflected exterior light.

In addition, a non-light emitting region of the third light shielding layer 140 may be arranged so as to cover an end part of a light shielding region of the first light shielding layer 136. As a result, it is possible to reduce a diffraction phenomenon in the vicinity of an end part of a light shielding region of the first light shielding layer 136, bleeding of a display image is small, and it is possible to provide a high definition display device 600.

Seventh Embodiment

Figure 17:
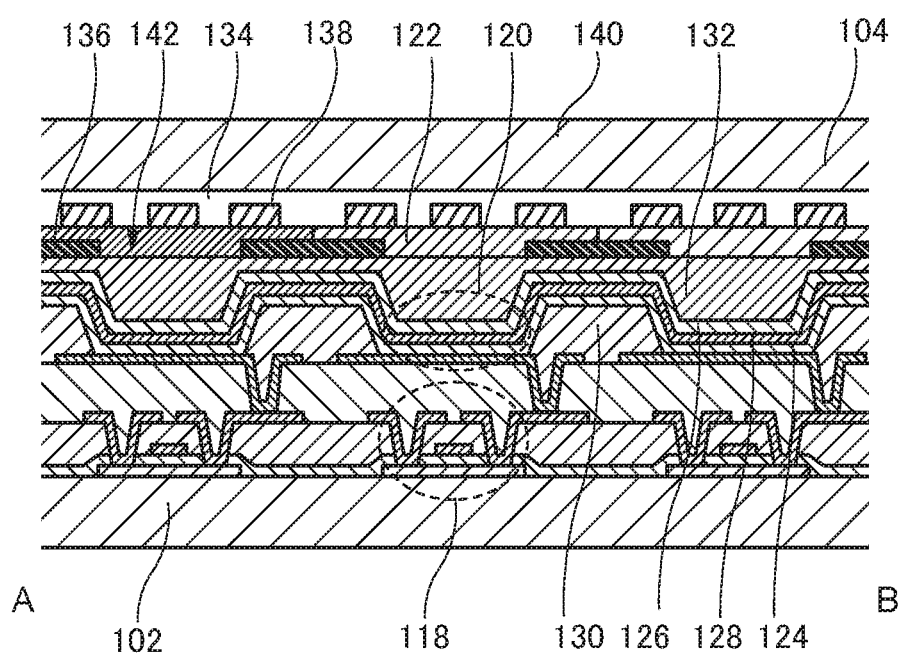
FIG. 17 is a cross-sectional diagram showing a structure of a display device related to one embodiment of the present invention.

The structure of a display device 700 related to the present embodiment is explained while referring to FIG. 17. The display device 700 according to the present embodiment is different to the display device 600 according to the sixth embodiment in that it is arranged with an individual pixel electrode 124, light emitting layer 128, common pixel electrode 126, sealing film 132, first light shielding layer 136, color filter 122 and third light shielding layer 140 in this order above the first substrate 102. That is, the first light shielding layer is arranged on the common electrode side of the color filter.

The spatial frequency of the display device 700 according to the present embodiment has a range of 90 cpd~110 cpd. In this range there are no problems with display characteristics with respect to visibility of reflected exterior light.

A non-light emitting region of the third light shielding layer 140 may be a semi-transparent layer and may be arranged above a light emitting region. As a result, it is possible to increase spatial frequency and efficiently suppress the occurrence of a rainbow pattern due to reflected exterior light.

In addition, a non-light emitting region of the third light shielding layer 140 may be arranged so as to cover an end part of a light shielding region of the first light shielding layer 136. As a result, it is possible to reduce a diffraction phenomenon in the vicinity of an end part of a light shielding region of the first light shielding layer 136, bleeding of a display image is small, and it is possible to provide a high definition display device 700.

The preferred forms of the present invention were explained above using the first to seventh embodiments. However, these embodiments are merely examples and the technical scope of the present invention should not be limited to these embodiments. A person ordinarily skilled in the art could carry out various modifications without departing from the gist of the present invention. Therefore, those modifications should also be interpreted as belonging to the technical scope of the present invention.

What is claimed is:

1. A display device, comprising:
 a display region arranged with a plurality of pixels in a matrix, the plurality of the pixels including a light emitting region;
 a first light shielding layer; and
 a second light shielding layer;
 wherein
 the first light shielding layer includes a plurality of first apertures opening the light emitting region, and a plurality of second apertures opening a non-light emitting region between the plurality of the pixels; and
 the second light shielding layer is arranged below the first light shielding layer and includes a plurality of third apertures opening the light emitting region, the second light shielding layer being arranged with a light shielding region below the second apertures.

2. The display device according to claim 1, wherein the light emitting region includes a color filter, the first light shielding layer is arranged above the color filter and the second light shielding layer is arranged below the color filter.

3. The display device according to claim 2, wherein the color filter includes a plurality of color filters, and
 the plurality of the color filters are separated below the second apertures.

4. The display device according to claim 1, wherein the plurality of the pixels include a first pixel and a second pixel adjacent to the first pixel, and at least two of the second apertures are arranged between the first pixel and the second pixel.

5. The display device according to claim 1, wherein the plurality of the pixels include a first pixel, a second pixel adjacent to the first pixel, and a third pixel adjacent to the first pixel on a different side to the second pixel;
 the plurality of the second apertures include a 1-2 intermediary aperture located between the first pixel and the second pixel, and a 1-3 intermediary aperture located between the first pixel and the third pixel;
 the 1-2 intermediary aperture includes a first length direction; and
 the 1-3 intermediary aperture includes a second length direction different to the first length direction.

6. A display device, comprising:
 a display region arranged with a plurality of pixels in a matrix, the plurality of the pixels including a light emitting region; and
 a first light shielding layer;
 wherein
 the first light shielding layer includes a plurality of first apertures opening the light emitting region, and a plurality of second apertures opening a non-light emitting region between the plurality of the pixels;
 each of the first apertures forms each of L character shapes;
 the plurality of the first apertures include four of the first apertures consisting of four of the L character shapes;
 the four of the first apertures are arranged in two adjacent rows and columns;
 the four of the L character shapes include a first pair of the L character shapes and a second pair of the L character shapes;
 the first pair of the L character shapes are arranged point symmetrically; and
 the second pair of the L character shapes are arranged point symmetrically.

7. The display device according to claim 6, further comprising a second light shielding layer,
 wherein the second light shielding layer includes a plurality of third apertures opening the light emitting region and has a light shielding region below the plurality of the second apertures.

8. A display device, comprising:
 a first substrate;
 a display region arranged above the first substrate including a plurality of pixels arranged in a matrix, the plurality of the pixels including a light emitting region;
 a first light shielding layer; and
 a third light shielding layer;
 wherein
 the first light shielding layer includes a plurality of first apertures opening the light emitting region;
 at least one part of the third light shielding layer is arranged on an opposite side of the light shielding layer from the first substrate; and
 the third light shielding layer includes a plurality of fourth apertures which are larger in number than the plurality of the first apertures.

9. The display device according to claim 8, wherein a sheet with translucency is arranged on an opposite side of the first light shielding layer from the first substrate, and the third light shielding layer is formed in the sheet.

10. The display device according to claim 9, wherein the sheet is arranged in contact with the first light shielding layer.

11. The display device according to claim 9, further comprising a second substrate facing the first substrate,
 wherein the first light shielding layer is located between the first substrate and the second substrate, and the sheet is located on an opposite side of the second substrate from the first substrate.

12. The display device according to claim 8, wherein the plurality of the fourth apertures include an aperture located between the plurality of the pixels.

13. The display device according to claim 8, wherein the plurality of the fourth apertures includes a plurality of apertures overlapping one light emitting region.

14. The display device according to claim 8, wherein a light emitting layer, a pixel electrode and a common electrode are arranged in the first substrate,
 a color filter is arranged in the first substrate and located on an opposite side of the common electrode from the first substrate, and
 the first light shielding layer is located on an opposite side of the color filter from the common electrode.

15. The display device according to claim 8, wherein a light emitting layer, a pixel electrode and a common electrode are arranged in the first substrate,
 a color filter is arranged in the first substrate and located on an opposite side of the common electrode from the first substrate,
 the first light shielding layer is located on a side of the color filter, the common electrode located on the side, and
 the third light shielding layer is located on an opposite side of the color filter from the first light shielding layer.

16. The display device according to claim 8, wherein the fourth apertures include an aperture opening the light emitting region, and an aperture opening a non-light emitting region between the plurality of the pixels.

17. The display device according to claim 8, wherein the light shielding layer further includes a semitransparent region.

18. The display device according to claim 17, wherein the semitransparent region is arranged above the light emitting region.

19. The display device according to claim 18, wherein each of the first apertures has an end part, and
 the end part is covered by the semitransparent region.

* * * * *